United States Patent
Cheng et al.

(10) Patent No.: US 8,598,664 B2
(45) Date of Patent: Dec. 3, 2013

(54) FIELD EFFECT TRANSISTOR (FET) AND METHOD OF FORMING THE FET WITHOUT DAMAGING THE WAFER SURFACE

(75) Inventors: Kangguo Cheng, Guilderland, NY (US); Bruce B. Doris, Brewster, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/420,763

(22) Filed: Mar. 15, 2012

(65) Prior Publication Data

US 2012/0168834 A1 Jul. 5, 2012

Related U.S. Application Data

(62) Division of application No. 12/698,191, filed on Feb. 2, 2010, now Pat. No. 8,324,110.

(51) Int. Cl.
*H01L 27/12* (2006.01)

(52) U.S. Cl.
USPC .... 257/347; 257/327; 257/623; 257/E21.702; 257/E21.703; 257/E21.704; 438/142; 438/149; 438/197; 438/689; 438/751

(58) Field of Classification Search
USPC .......... 257/9, 288, 327, 347, 618, 623, E21.7, 257/E21.702, E21.703, E21.704
See application file for complete search history.

(56) References Cited

U.S. PATENT DOCUMENTS

| 5,682,055 A * | 10/1997 | Huang et al. ............. 257/408 |
| 5,955,770 A * | 9/1999 | Chan et al. .............. 257/408 |
| 6,043,536 A * | 3/2000 | Numata et al. ........... 257/347 |
| 6,251,764 B1 | 6/2001 | Pradeep et al. |
| 6,500,745 B1 | 12/2002 | Ikegami |
| 6,762,085 B2 | 7/2004 | Zheng et al. |
| 6,800,513 B2 * | 10/2004 | Horiuchi et al. ........... 438/157 |
| 6,908,800 B1 | 6/2005 | Kim et al. |
| 6,987,050 B2 | 1/2006 | Cabral, Jr. et al. |
| 7,229,869 B2 | 6/2007 | Yoon et al. |
| 7,423,323 B2 * | 9/2008 | Chen et al. ............... 257/347 |
| 7,799,650 B2 | 9/2010 | Bo et al. |
| 2002/0022366 A1 * | 2/2002 | Cabral et al. .............. 438/682 |
| 2005/0156248 A1 * | 7/2005 | Chen et al. ............... 257/353 |

(Continued)

OTHER PUBLICATIONS

U.S. Appl. No. 12/698,191, IBM, Notice of Allowance Communication, May 17, 2012, 9 pages.
U.S. Appl. No. 12/698,191, filed Feb. 2, 2010, IBM, Office Action Communication, Oct. 12, 2011, 6 pages.
U.S. Appl. No. 12/698,191, filed Feb. 2, 2010, IBM, Office Action Communication, Dec. 14, 2011, 16 pages.
U.S. Appl. No. 12/698,191, filed Feb. 2, 2010, IBM, Office Action Communication, Dated Apr. 30, 2012, 23 pages.

*Primary Examiner* — Eduardo A Rodela
(74) *Attorney, Agent, or Firm* — Gibb & Riley, LLC (57) ABSTRACT

Disclosed are a field effect transistor structure and a method of forming the structure. A gate stack is formed on the wafer above a designated channel region. Spacer material is deposited and anisotropically etched until just prior to exposing any horizontal surfaces of the wafer or gate stack, thereby leaving relatively thin horizontal portions of spacer material on the wafer surface and relatively thick vertical portions of spacer material on the gate sidewalls. The remaining spacer material is selectively and isotropically etched just until the horizontal portions of spacer material are completely removed, thereby leaving only the vertical portions of the spacer material on the gate sidewalls. This selective isotropic etch removes the horizontal portions of spacer material without damaging the wafer surface. Raised epitaxial source/drain regions can be formed on the undamaged wafer surface adjacent to the gate sidewall spacers in order to tailor source/drain resistance values.

10 Claims, 8 Drawing Sheets

(56) References Cited

U.S. PATENT DOCUMENTS

| | | |
|---|---|---|
| 2007/0018205 A1* | 1/2007 | Chidambarrao et al. ..... 257/288 |
| 2008/0067590 A1 | 3/2008 | Mise et al. |
| 2008/0157131 A1* | 7/2008 | Singh et al. .................. 257/288 |
| 2008/0311716 A1* | 12/2008 | Chen ............................. 438/289 |
| 2009/0098665 A1 | 4/2009 | Bu et al. |

\* cited by examiner

FIELD EFFECT TRANSISTOR (FET) AND METHOD OF FORMING THE FET WITHOUT DAMAGING THE WAFER SURFACE

CROSS-REFERENCE TO RELATED APPLICATIONS

This application is a Division of U.S. patent application Ser. No. 12/698,191 filed Feb. 2, 2010 U.S. Pat. No. 8,324,110, issued Dec. 4, 2012, the complete disclosure of which, in its entirety, is herein incorporated by reference.

BACKGROUND

1. Field of the Invention

The embodiments of the invention generally relate to field effect transistors (FETs) and, more specifically, to a FET structure formed on a semiconductor wafer (e.g., a silicon-on-insulator (SOI) wafer, a bulk silicon wafer, etc.) and a method of forming the FET structure on a semiconductor wafer without damaging the wafer surface.

2. Description of the Related Art

Conventional techniques for forming field effect transistor (FETs) on semiconductor wafers (e.g., a silicon-on-insulator (SOI) wafers, bulk silicon wafers, etc.) often result in damage to the wafer surface, particularly in the FET source/drain and source/drain extension regions. As devices are scaled in size, wafer surface damage can have an increasingly significant impact on device formation and, ultimately, on device performance. Therefore, there is a need in the art for an improved FET structure and a method of forming the FET structure without damaging the semiconductor wafer surface.

SUMMARY

Disclosed herein are embodiments of a planar field effect transistor (FET) structure on a semiconductor wafer, where the wafer surface, particularly, in the FET source/drain regions, is essentially damage-free. Specifically, this FET structure can comprise a semiconductor layer. The semiconductor layer can comprise, for example, a single crystalline silicon layer of a silicon-on-insulator (SOI) wafer. Alternatively, the semiconductor layer can comprise a bulk silicon wafer. The FET structure can further comprise a gate stack on the top surface of the semiconductor layer. Gate sidewall spacers (e.g., silicon nitride (SiN) gate sidewall spacers) can be positioned on opposing sidewalls of the gate stack. Additionally, a channel region can be positioned within the semiconductor layer aligned below the gate stack and source/drain regions can be positioned within the semiconductor layer adjacent to the channel region (i.e., on both sides of the channel region). Optionally, raised epitaxial source/drain regions can be positioned on the top surface of the semiconductor layer above the source/drain regions. As discussed in greater detail below with regard to the method embodiments, due to the technique used to form the gate sidewall spacers on the gate stack, the top surface of the semiconductor layer remains essentially damage-free during processing such that in the resulting FET structure the portion of the top surface of the semiconductor layer above the channel region is level with the portions of the top surface of the semiconductor layer above the source/drain regions.

Also disclosed herein are embodiments of a method of forming such a planar FET structure on a semiconductor wafer such that the wafer surface, particularly, in the FET source/drain regions, remains essentially damage-free. Generally, the method can comprise providing a semiconductor layer. Next, a gate stack can be formed on the top surface of the semiconductor layer. Then, gate sidewall spacers can be formed on the opposing sidewalls of the gate stack, particularly, without damaging the adjacent wafer surface.

In order to form gate sidewall spacers without damaging the adjacent wafer surface, a blanket spacer material layer can be deposited such that it covers the gate stack and also covers the exposed top surface of the semiconductor layer adjacent to the gate stack. Next, the spacer material layer can be anisotropically etched (e.g., by a reactive ion etch (RIE) process), stopping just prior to exposing the top surface of the semiconductor layer such that horizontal portions of the spacer material layer remain on the top surface of the semiconductor layer and vertical portions of the spacer material layer remain on the opposing sidewalls of the gate stack. Since this etch process is anisotropic, the horizontal portions of the spacer material layer will be relatively thin as compared to the vertical portions. Following the anisotropic etch process, the spacer material layer is further isotropically etched (e.g., by a highly selective wet etch process), stopping upon complete removal of the relatively thin horizontal portions of the spacer material layer from the top surface of the semiconductor layer, but prior to complete removal of the relatively thick vertical portions of the spacer material layer from the opposing sidewalls of the gate stack, thereby forming the gate sidewall spacers. Since this etch process is isotropic and highly selective, the exposed portions of the top surface of the semiconductor layer adjacent to the gate sidewall spacers are not damaged when the horizontal portions of the spacer material layer are etched away.

In one particular embodiment, the method can comprise providing a silicon-on-insulator (SOI) wafer comprising: a semiconductor substrate; an insulator layer on the semiconductor substrate; and a single crystalline silicon layer on the insulator layer. Optionally, the SOI wafer provided can comprise an extra-thin silicon-on-insulator (ETSOI) wafer in which the single crystalline silicon layer has a uniform thickness equal to at least a minimum thickness required for epitaxial silicon growth (e.g., approximately 1-3 nm). Next, a gate stack can be formed on the top surface of the silicon layer. Then, silicon nitride (SiN) gate sidewall spacers can be formed on the opposing sidewalls of the gate stack, particularly, without damaging the adjacent wafer surface. To accomplish this, a blanket SiN layer can be deposited such that it covers the gate stack and also the exposed top surface of the silicon layer adjacent to the gate stack. Next, the SiN layer can be anisotropically etched (e.g., by a reactive ion etch (RIE) process), stopping just prior to exposing the top surface of the silicon layer such that horizontal portions of the SiN layer remain on the top surface of the silicon layer and vertical portions of the SiN layer remain on the opposing sidewalls of the gate stack. Since this etch process is anisotropic, the horizontal portions of the SiN layer will be relatively thin as compared to the vertical portions. Following the anisotropic etch process, the SiN layer is further isotropically etched (e.g., by a highly selective wet etch process), stopping upon complete removal of the relatively thin horizontal portions of the SiN layer from the top surface of the silicon layer, but prior to complete removal of the relatively thick vertical portions of the SiN layer from the opposing sidewalls of the gate stack, thereby forming the SiN gate sidewall spacers. Since this etch process is isotropic and highly selective, the exposed portions of top surface of the silicon layer adjacent to the SiN gate sidewall spacers are not damaged when the horizontal portions of the SiN layer are etched away. Optionally, after this isotropic etch process is performed, an epitaxial silicon layer (e.g., a raised epitaxial source/drain region) can be grown on at least one of the exposed portions of the top surface. It should be noted that the isotropic etch process can, optionally, be performed without performing a discrete pre-cleaning process.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, conventional techniques for forming planar field effect transistor (FETs) on semiconductor wafers (e.g., a silicon-on-insulator (SOI) wafers, bulk silicon wafers, etc.) often result in damage to the wafer surface. Unfortunately, as devices are scaled in size, this wafer surface damage can have an increasingly significant impact on device formation and, ultimately, on device performance.

Figure 10:
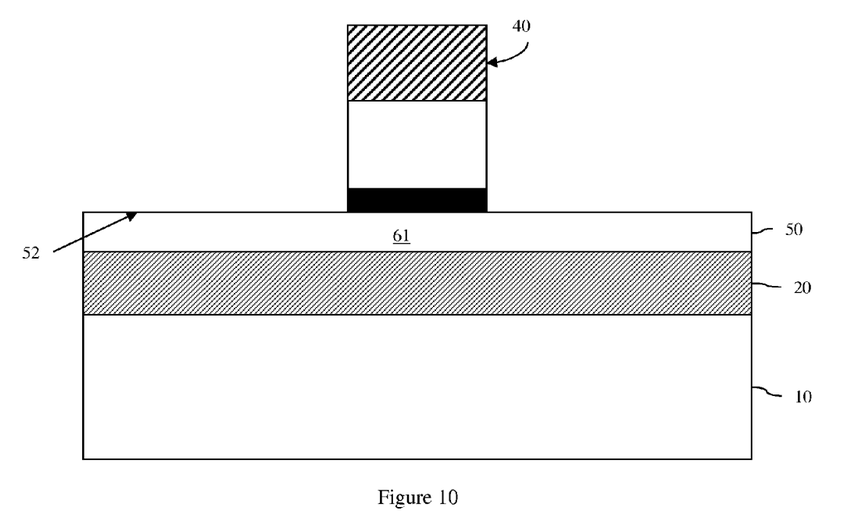
FIG. 10 is a cross-section diagram illustrating a partially completed field effect transistor.

For example, it has been proposed that an extra-thin silicon-on-insulator (ETSOI) wafer could be used in order to provide a planar FET architecture suitable for the 22 nm technology node and beyond. An ETSOI wafer is a silicon-on-insulator (SOI) wafer comprising a semiconductor substrate 10, an insulator layer 20 on the semiconductor substrate 10 and an extra thin (e.g., less than 6 nm thick) single crystalline silicon layer 50 on the insulator layer 20 (see FIG. 10). A gate stack 40 could be formed on the top surface 52 of thin silicon layer 50, thereby creating a FET channel region 61 that is less than 3 nm thick. Then, conventional FET processing could be performed to complete the FET structure (e.g., halo and/or source/drain extension formation, gate sidewall spacer formation, source/drain formation, silicide formation, interlayer dielectric deposition, contact formation, etc.). However, since the silicon layer 50 is less than 6 nm thick, the resulting source/drain regions would have unacceptably high resistance. To compensate, epitaxial semiconductor layers could be formed on the wafer surface above the source/drain regions, thereby creating raised source/drain regions and lowering the source/drain resistance to a desired level. The resulting ETSOI planar FET would be fully depleted with a natural ultra-shallow junction, thereby allowing for superior control of short-channel effects.

Figure 11:
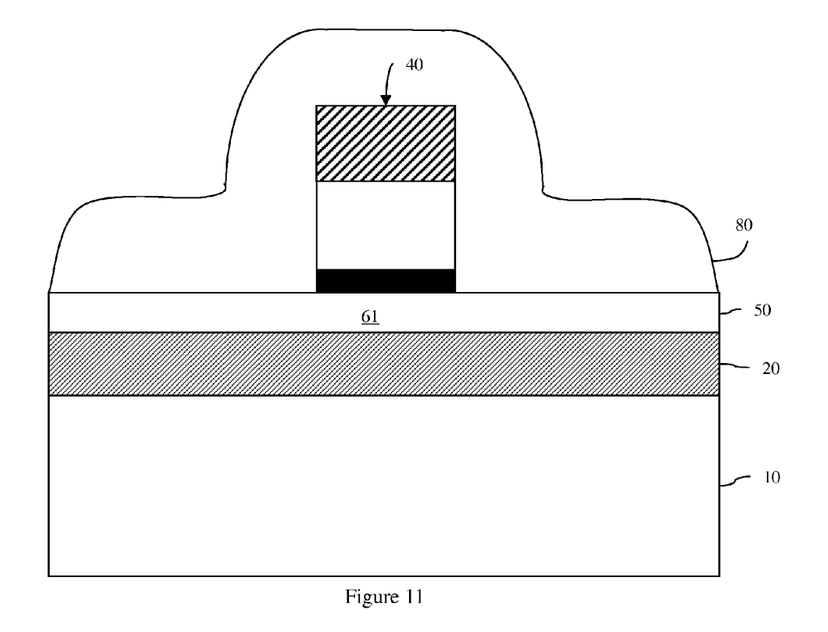
FIG. 11 is a cross-section diagram illustrating a partially completed field effect transistor.
Figure 12:
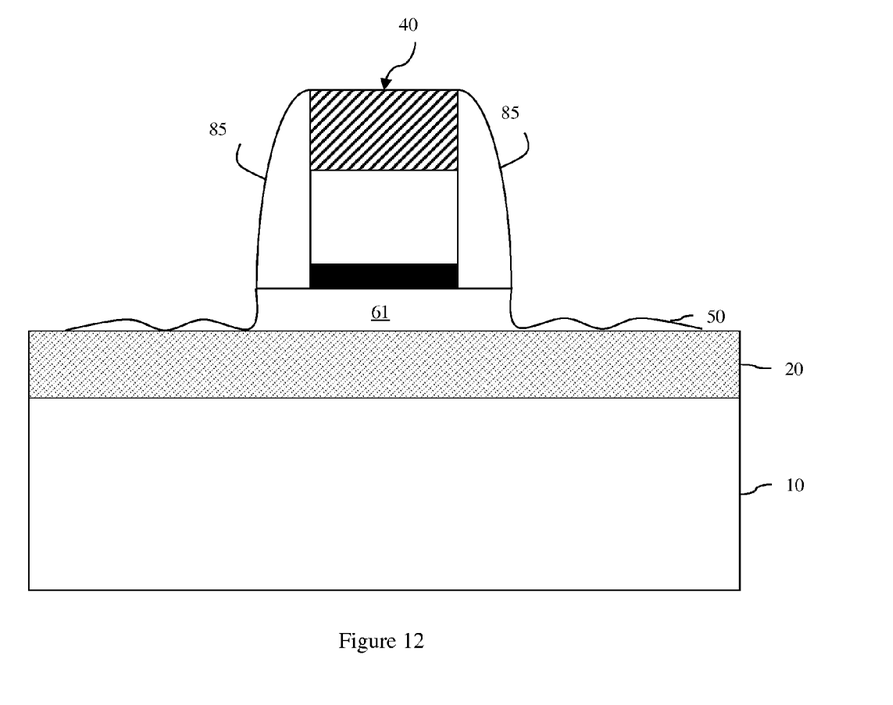
FIG. 12 is a cross-section diagram illustrating a partially completed field effect transistor.

However, conventional planar FET processing techniques and, particularly, gate sidewall spacer formation techniques involve one or more reactive ion etch (RIE) processes that inevitably result in silicon loss (e.g., of up to 3 nm or more) at the wafer surface. Specifically, gate sidewall spacer formation typically involves deposition of a spacer material layer 80 (e.g., a SiN layer) such that it covers the gate stack 40 and any exposed surfaces of the silicon layer 50 (see FIG. 11). Next, a first etch is performed in a reactive ion etch (RIE) chamber and followed, in the same chamber, by a second, slower, over-etch process, which results in not only gate sidewall spacer 85 formation but also in significant silicon loss at the wafer surface (e.g., loss of 3-6 nm or more) (see FIG. 12). Even if the specifications for the RIE processes and, particularly, the second, over-etch, process are designed to be selective for the spacer material, silicon loss at the wafer surface inevitably results because the wafer surface is physically bombarded with ions and there is some spread in the ion energy. In the case of an ETSOI wafer, since the silicon layer 50 is only 6 nm or less, this silicon loss at the wafer surface effectively removes some, if not all, of the silicon layer 50 in the source/drain regions, as shown in FIG. 12. Unfortunately, insufficient silicon material in the source/drain regions to act as seed material will result in sporadic epitaxial silicon growth or even no epitaxial silicon growth for raised epitaxial source/drain regions. Therefore, there is a need in the art for an improved planar FET structure and a method of forming the FET structure without damaging the semiconductor wafer surface.

In view of the foregoing, disclosed herein are embodiments of a planar field effect transistor (FET) structure on a semiconductor wafer (e.g., a silicon-on-insulator (SOI) wafer, a bulk silicon wafer, etc.), where the surface of the wafer, particularly, in the FET source/drain regions, is essentially damage-free. Also disclosed herein are embodiments of a method of forming such a FET structure. In the method embodiments, a gate stack is formed on the wafer surface above a designated channel region and, then, gate sidewall spacers are formed on the gate stack without damaging the adjacent wafer surface. Specifically, after spacer material is deposited over the gate stack, the spacer material is anisotropically etched (e.g., by reactive ion etch (RIE)) until just prior to exposing any horizontal surfaces of the wafer, thereby leaving relatively thin horizontal portions of spacer material on the wafer surface and relatively thick vertical portions of spacer material on the gate sidewalls. Then, the remaining spacer material is selectively and isotropically etched (e.g., by wet etch) just until the horizontal portions of spacer material are completely removed, thereby leaving only the vertical portions of the spacer material on the gate sidewalls. The isotropic etch process removes the horizontal portions of spacer material without damaging the wafer surface below.

Raised epitaxial source/drain regions can then be formed on the undamaged wafer surface adjacent to the gate sidewall spacer in order to tailor source/drain resistance values.

Figure 1:
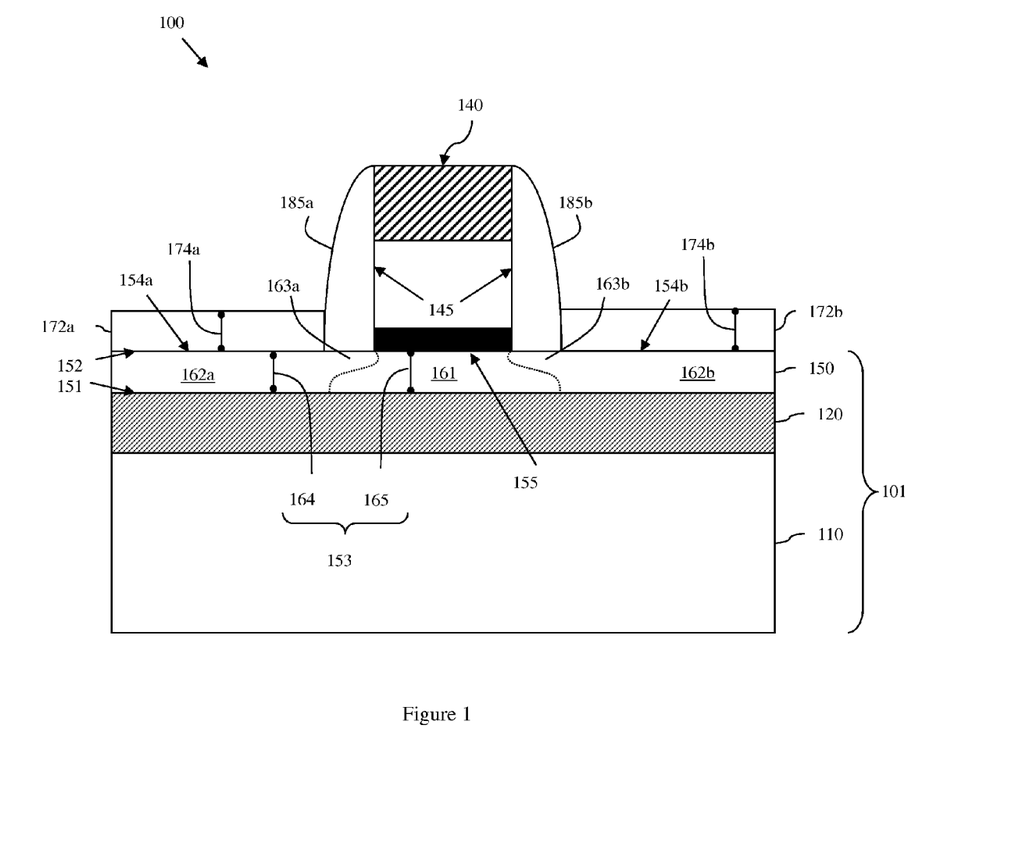
FIG. 1 is a cross-section diagram illustrating an embodiment of a field effect transistor.

More particularly, referring to FIG. 1, disclosed herein are embodiments of a planar field effect transistor (FET) structure 100 on a semiconductor wafer 101 (e.g., a silicon-on-insulator (SOI) wafer, a bulk silicon wafer, etc.), where the top surface 152 of the wafer 101 and, particularly, in the FET source/drain regions 162a-b, is essentially damage-free.

Specifically, this FET structure 100 can comprise a semiconductor layer 150, having a bottom surface 151 and a top surface 152 opposite the bottom surface 151. In one particular embodiment, the semiconductor layer 150 can comprise a single crystalline silicon layer of a silicon-on-insulator (SOI) wafer, as illustrated. Such an SOI wafer can comprise a semiconductor substrate 110 (e.g., a silicon substrate), an insulator layer 120 (e.g., a buried oxide (BOX) layer or any other suitable insulator layer) on the semiconductor substrate 110, and a single crystalline silicon layer 150 on the insulator layer 120.

Optionally, this SOI wafer can comprise an extremely-thin silicon-on-insulator (ETSOI) wafer in which the single crystalline silicon layer 150 has an essentially uniform thickness 153 of less than 10 nm and at least equal to a minimum thickness required for epitaxial silicon growth (e.g., approximately 1-3 nm). For example, a silicon layer thickness of 5-6 nm can enable a channel region with good electro statics for a 25 nm or less gate length. However, for other technologies such as technologies having a targeted gate length of 10 nm or less, a silicon layer thickness of less than 5 nm (e.g., 1-3 nm) may be desirable. Furthermore, those skilled in the art will recognize that, although the thickness 153 of the semiconductor layer 150 is essentially uniform, minor differences in the semiconductor layer thickness between different regions may occur (e.g., a difference of up to 0.5-1.5 nm may occur between a thickest region and thinnest region) as a function of the techniques used to form the semiconductor layer 150. Alternatively, the semiconductor layer 150 can comprise a bulk silicon substrate.

A gate stack 140 can be positioned on the top surface 152 of the semiconductor layer 150. The gate stack 140 can comprise any suitable gate stack configuration for a planar FET. For example, the gate stack 140 can comprise a gate dielectric layer (e.g., a silicon dioxide layer, a high-k dielectric layer or any other suitable gate dielectric layer) adjacent to the semiconductor layer 150, a gate conductor layer (e.g., a doped polysilicon layer, a metal layer, any other suitable conductor layer or a combination thereof) on the gate dielectric layer and, optionally, a cap layer (e.g., a silicon nitride (SiN) layer or any other suitable cap layer) on the gate conductor layer.

Gate sidewall spacers 185a-b can be positioned on opposing sidewalls 145 of the gate stack 140. The gate sidewall spacers 185a-b can comprise silicon nitride (SiN) or any other suitable dielectric spacer material. The width of the gate sidewall spacers 185a-b can taper such that at the top of the gate stack 140 they are relatively thin and at the bottom of the gate stack 140 near the wafer surface 152 they are relatively thick.

A channel region 161 can be positioned within the semiconductor layer 150 aligned below the gate stack 140. Source/drain regions 162a-b can be within the semiconductor layer 150 on either side of the gate stack 140 such that the channel region 161 is positioned laterally between the source/drain regions 162a-b. Optionally, source/drain extension regions 163a-b can be positioned within the semiconductor layer 150 below the gate sidewall spacers 185a-b, respectively. These source/drain extension regions 163a-b can be shallower in depth than the source/drain regions 162a-b and can extend laterally from the source/drain regions 162a-b to the channel region 161. Also, optionally, halo regions (not shown) can be positioned along the borders of the source/drain regions 162a-b and/or source/drain extension regions 163a-b such that the halo regions are positioned laterally between the source/drain regions 162a-b and/or source/drain extension regions 163a-b and the channel region 161.

Those skilled in the art will recognize that if the FET 100 comprises an n-type FET (NFET), then the source/drain regions 162a-b can be heavily doped with an n-type conductivity dopant, the source/drain extension regions 163a-b can be lightly doped with either the same or a different n-type conductivity dopant, and the halo regions can be doped with a p-type conductivity dopant. Conversely, if the FET 100 comprises a p-type FET (PFET), then the source/drain regions 162a-b can be heavily doped with a p-type conductivity dopant, the source/drain extension regions 163a-b can be lightly doped with either the same or a different p-type conductivity dopant and the halo regions can be doped with a n-type conductivity dopant. Planar FET source/drain regions, source/drain extension regions and halo regions are well-known in the art and, thus, the details of such FET components are omitted from this specification in order to allow the reader to focus on the salient aspects of the embodiments described herein.

As discussed in greater detail below with regard to the method embodiments, due to the disclosed technique used to form the gate sidewall spacers 185a-b, the top surface 152 of the semiconductor layer 150 is essentially damage-free. Thus, a first portion 155 of the top surface 152 of the semiconductor layer 150 above the channel region 161 is essentially level with second portions 154a-b of the top surface 152 of the semiconductor layer 150 above the source/drain regions 162a-b, respectively. Thus, assuming that the bottom surface 151 of the semiconductor layer 150 is essentially planar and parallel to the top surface 152, the thickness 153 of the semiconductor layer 150 in the FET structure 100 is essentially uniform. That is, a first thickness 165 of the semiconductor layer 150 at the channel region 161 is essentially equal to a second thickness 164 of the semiconductor layer 150 at either of the source/drain regions 162a-b.

The FET structure 100 can further comprise epitaxial semiconductor layer(s) 172a-b (e.g., epitaxial silicon layer(s)) on the top surface 152 of the semiconductor layer 150 above any one or both of the source/drain regions 162a-b, respectively. The epitaxial semiconductor layer(s) 172a-b can be appropriately doped (e.g., with an n-type conductivity dopant for an NFET or a p-type conductivity dopant for a PFET) such that they comprise raised epitaxial source/drain region(s). Each raised epitaxial source/drain region 172a-b can have a predetermined thickness 174a-b and, thereby, a predetermined resistance value. The thicknesses 174a-b of epitaxial semiconductor layers 172a-b above each of the source/drain regions 162a-b may be the same (as illustrated). Alternatively, the thickness 174a of an epitaxial semiconductor layer 172a above one source/drain region 162a may be different from the thickness 174b of an epitaxial semiconductor layer 172b above the other source/drain region 162b. For example, above a source region, the epitaxial semiconductor layer may be relatively thick in order to minimize series resistance in the source region (i.e., in order to ensure that series resistance is less than a predetermined resistance value). However, above a drain region in the same FET, the epitaxial semiconductor layer may be relatively thin in order to minimize gate to drain capacitance (i.e., in order to simultaneously ensure that gate to drain capacitance is less than a predetermined capacitance value).

It should be noted that in an embodiment, as described above, comprising epitaxial semiconductor layers 172a-b, the uniform thickness 153 of the semiconductor layer 150 and, particularly, the thickness 164 of the semiconductor layer 150 in the source/drain regions 162a-b must be equal to or greater than the minimum thickness required for epitaxial semiconductor growth. For example, in an embodiment in which the semiconductor layer 150 and epitaxial semiconductor layers 172a-b both comprise silicon, the uniform thickness 153 of the silicon layer 150 and, particularly, the thickness 164 of the silicon layer 150 in the source/drain regions 162a-b must be at least 1 nm (e.g., approximately 1-3 nm) in order to properly form epitaxial silicon layers 172a-b, given current state of the art requirements for epitaxial silicon growth.

Figure 2:
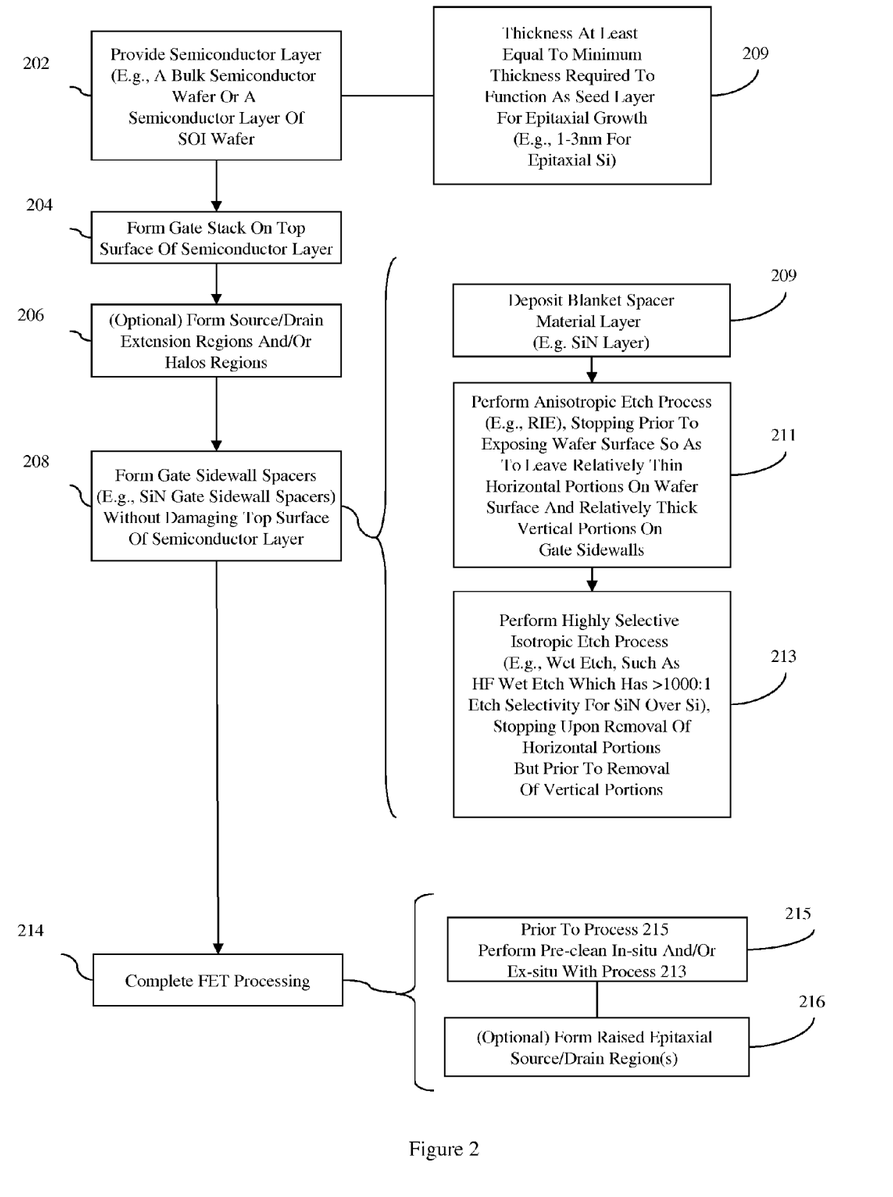
FIG. 2 is a flow diagram illustrating embodiments of a method of forming the field effect transistor of FIG. 1.

Referring to the flow diagram of FIG. 2, also disclosed herein are embodiments of a method of forming such a planar FET structure 100, as illustrated in FIG. 1, on a semiconductor wafer (e.g., a silicon-on-insulator (SOI) wafer, a bulk silicon wafer, etc.) such that the surface 152 of the wafer, particularly, in the FET source/drain regions 162a-b, remains essentially damage-free.

Figure 3:
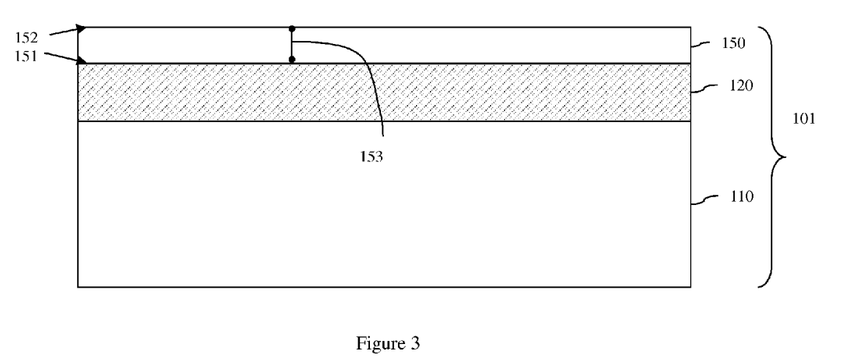
FIG. 3 is a cross-section diagram illustrating a partially completed field effect transistor formed according to the method of FIG. 2.

Generally, the method can comprise providing a semiconductor layer 150, having a bottom surface 151 and a top surface 152 opposite the bottom surface 151 (202, see FIG. 3). The top and bottom surfaces 151, 152 can be essentially planar and parallel such that the semiconductor layer 150 has an essentially uniform thickness 153. However, those skilled in the art will recognize that, although the thickness 153 of the semiconductor layer 150 is essentially uniform, minor differences in the semiconductor layer thickness between different regions may occur (e.g., a difference of up to 0.5-1.5 nm may occur between a thickest region and thinnest region) as a function of the techniques used to form the semiconductor layer.

In one exemplary embodiment, the semiconductor layer 150 can comprise a single crystalline silicon layer of a silicon-on-insulator (SOI) wafer 101. That is, the method can comprise providing a silicon-on-insulator (SOI) wafer 101 comprising: a semiconductor substrate 110 (e.g., a silicon substrate); an insulator layer 120 (e.g., a buried oxide (BOX) layer or other suitable insulator layer) on the semiconductor substrate 110; and a single crystalline silicon layer 150 on the insulator layer 120. Optionally, this SOI wafer 101 can comprise an extra-thin silicon-on-insulator (ETSOI) wafer in which the single crystalline silicon layer 150 has an essentially uniform thickness 153 that is less than 10 nm and at least equal to a minimum thickness required for epitaxial silicon growth (e.g., approximately 1-3 nm). For example, a silicon layer thickness of 5-6 nm enables channel region with good electro statics for a 25 nm or less gate length. However, for other technologies such as technologies having a targeted gate length of 10 nm or less, a silicon layer with a thickness of less than 5 nm (e.g., 1-3 nm) may be desirable. Those skilled in the art will recognize that ETSOI wafers typically have a 10-12 nm thick silicon layer, as manufactured and received. This silicon layer can be thinned (e.g., by chemical mechanical planarization (CMP) or other suitable technique) to the desired thickness. In an alternative embodiment, the semiconductor layer 150 can comprise a bulk semiconductor substrate (e.g., a bulk silicon substrate) (not shown).

Figure 4:
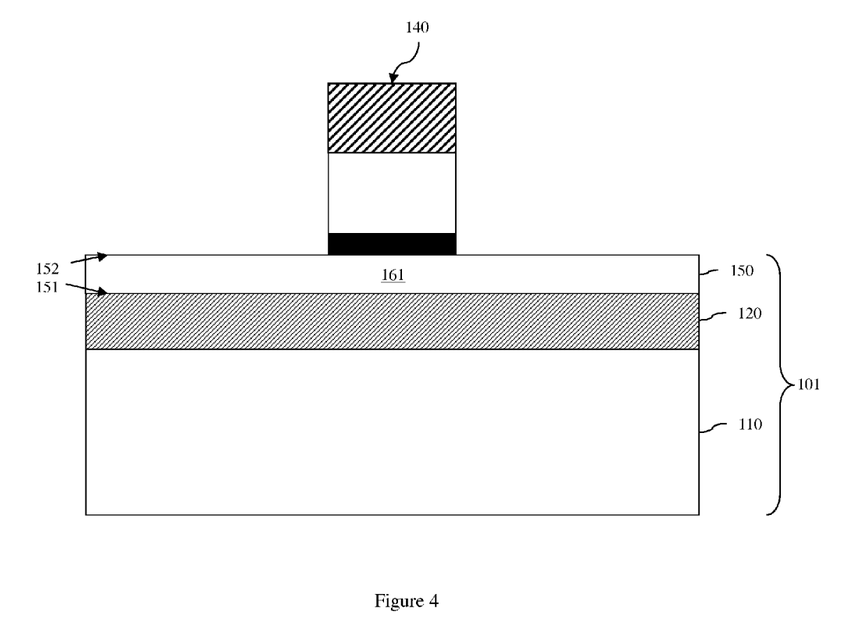
FIG. 4 is a cross-section diagram illustrating a partially completed field effect transistor formed according to the method of FIG. 2.

Next, a gate stack 140 can be formed on the top surface 152 of the semiconductor layer 150 over a designated channel region 161 (204, see FIG. 4). The gate stack 140 can be formed, for example, by forming a gate dielectric layer (e.g., a silicon dioxide layer, a high-k dielectric layer or any other suitable gate dielectric layer) on the top surface of the semiconductor layer 150. Next, a gate conductor layer (e.g., a doped polysilicon layer, a metal layer, any other suitable conductor layer or combination thereof) can be formed on the gate dielectric layer and, optionally, a cap layer (e.g., a silicon nitride (SiN) layer or any other suitable cap layer) can be formed on the gate conductor layer. The gate dielectric layer-gate conductor layer-cap layer stack can then be patterned, e.g., using conventional lithographic patterning techniques, in order to form the gate stack 140. Formation techniques for gate stacks are well-known in the art and, thus, the details of such formation techniques are omitted from this specification in order to allow the reader to focus on the salient aspects of the embodiments described herein.

Figure 5:
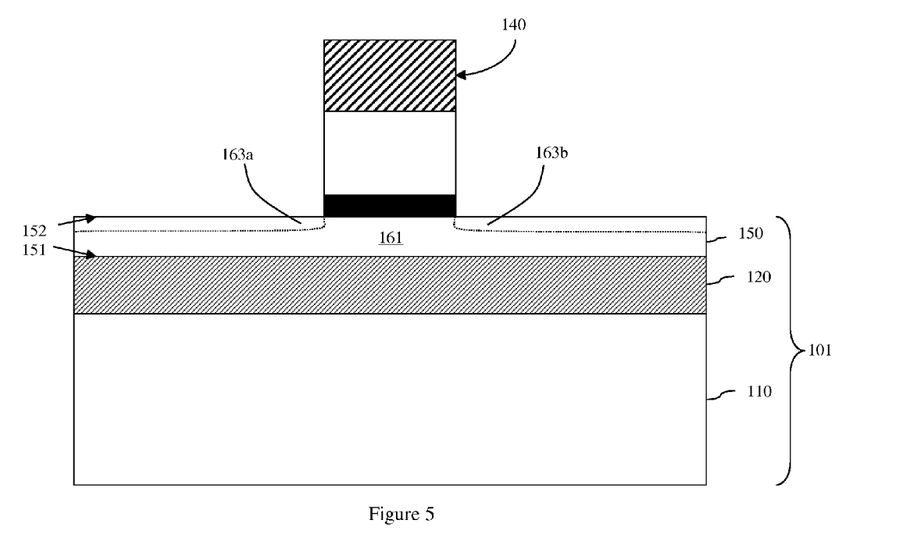
FIG. 5 is a cross-section diagram illustrating a partially completed field effect transistor formed according to the method of FIG. 2.

Optionally, after gate stack 140 formation at process 204, shallow source/drain extension regions 163a-b and/or halo regions (not shown) can be formed in the semiconductor layer 150 adjacent to the channel region 161 (206, see FIG. 5). Those skilled in the art will recognize that if the FET 100 is to comprise an NFET, then the shallow source/drain extension regions 163a-b can comprise an n-type conductivity dopant, whereas the halo regions (not shown) can comprise a p-type conductivity dopant. Conversely, if the FET 100 is to comprise a PFET, then the source/drain extension regions 163a-b can comprise a p-type conductivity dopant, whereas the halo regions (not shown) can be comprise an n-type conductivity dopant. Formation techniques for both source/drain extension regions and halo regions are well-known in the art and, thus, the details of such formation techniques are omitted from this specification in order to allow the reader to focus on the salient aspects of the embodiments described herein.

Figure 6:
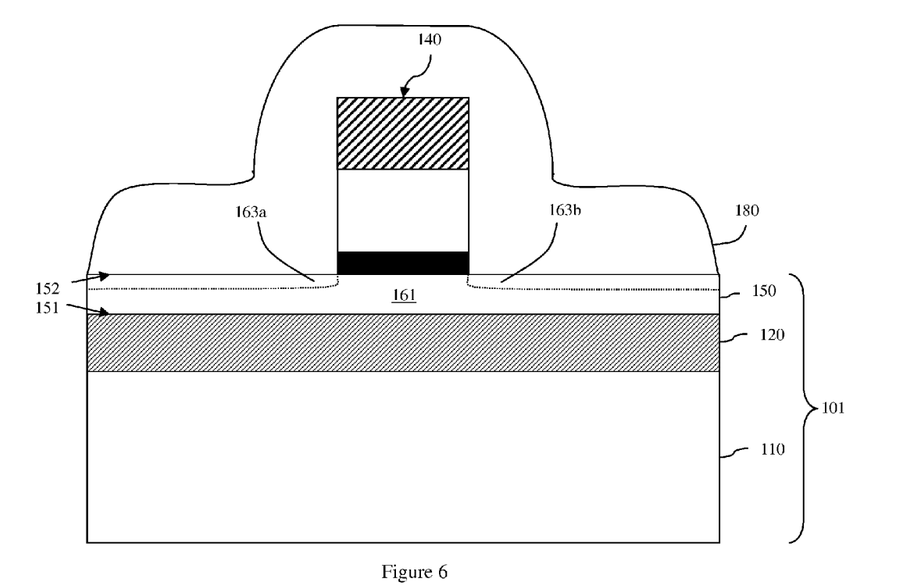
FIG. 6 is a cross-section diagram illustrating a partially completed field effect transistor formed according to the method of FIG. 2.
Figure 7:
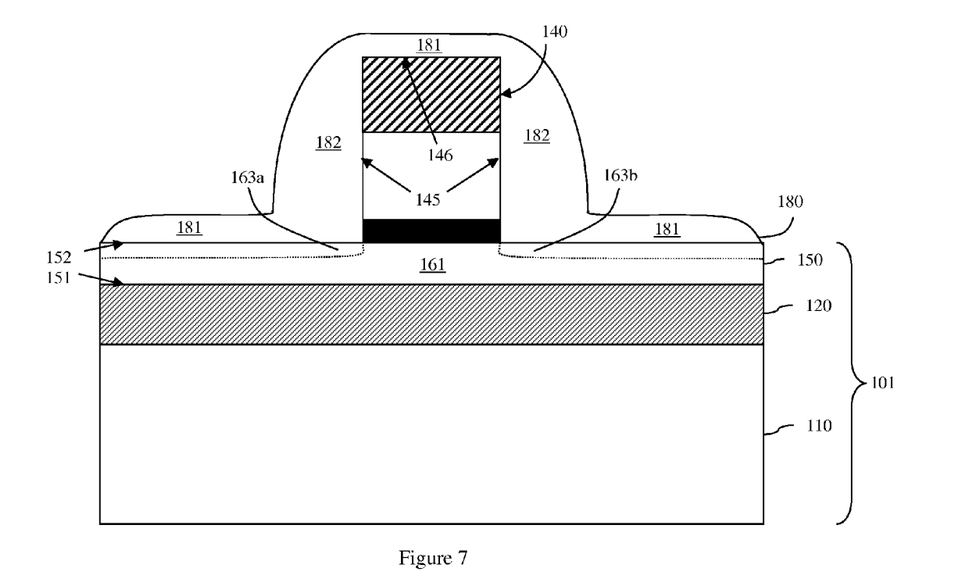
FIG. 7 is a cross-section diagram illustrating a partially completed field effect transistor formed according to the method of FIG. 2.
Figure 8:
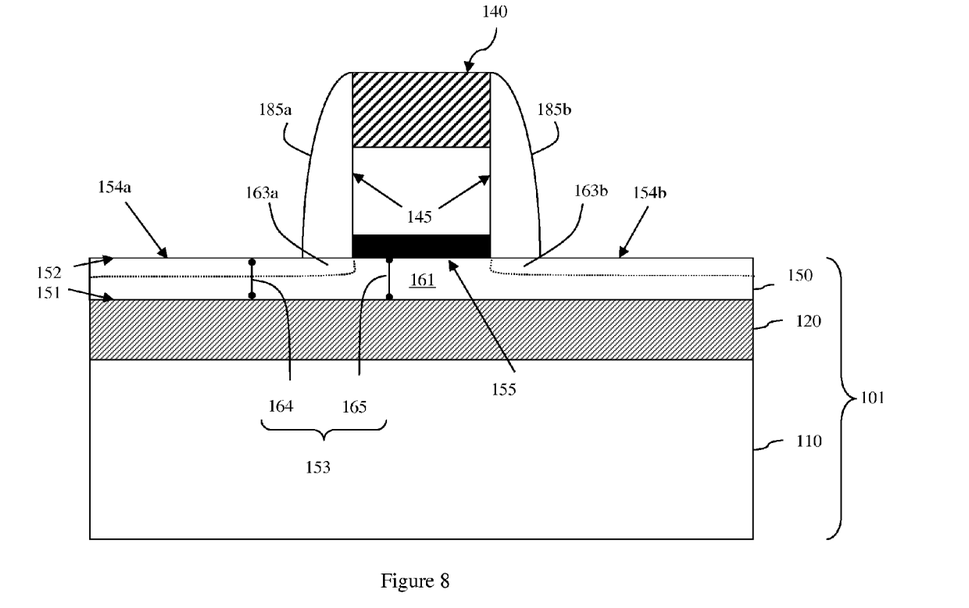
FIG. 8 is a cross-section diagram illustrating a partially completed field effect transistor formed according to the method of FIG. 2.
Figure 9:
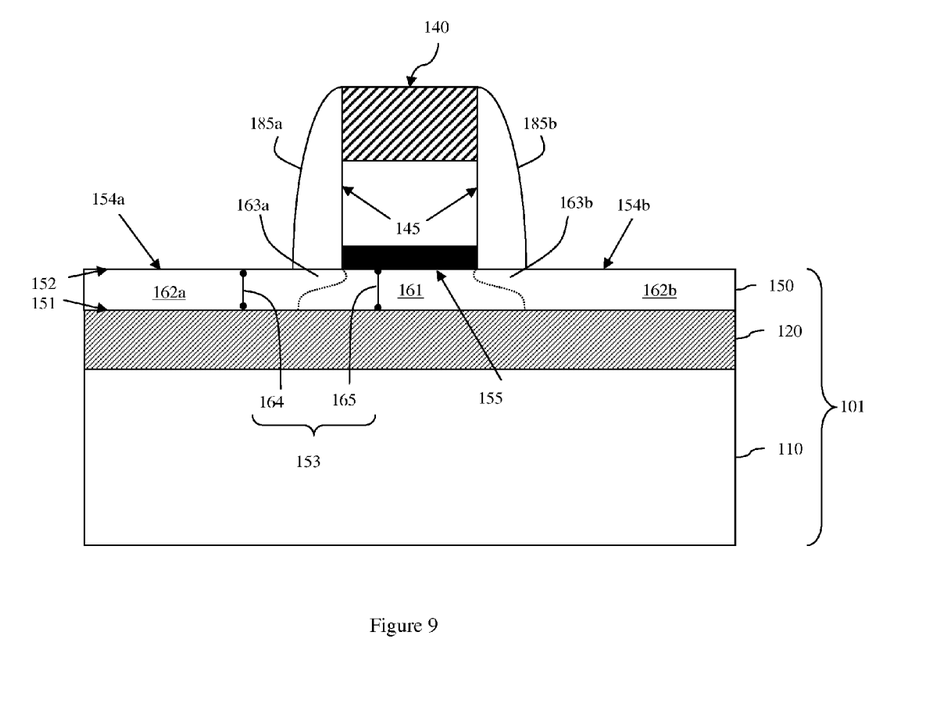
FIG. 9 is a cross-section diagram illustrating a partially completed field effect transistor formed according to the method of FIG. 2.

Next, gate sidewall spacers 185a-b can be formed on the opposing sidewalls 145 of the gate stack 140, particularly, without damaging the adjacent wafer surface (208, see FIG. 1). Specifically, a blanket spacer material layer 180 can be deposited such that it covers the gate stack 140 and also the top surface 152 of the semiconductor layer 150 adjacent to the gate stack 140 (209, see FIG. 6). Next, the spacer material layer 180 can be anisotropically etched (e.g., by a reactive ion etch (RIE) process), stopping just prior to exposing any of the top surface 152 of the semiconductor layer 150 (211, see FIG. 7). Following this anisotropic etch process, horizontal portions 181 of the spacer material layer 180 will remain on first portions 154a-b of the top surface 152 of the semiconductor layer 150 and also on the top surface of the gate stack 140. Additionally, vertical portions 182 of the spacer material layer 180 will remain on the opposing sidewalls 145 of the gate stack 140. Furthermore, since the etch process 211 is anisotropic, the remaining horizontal portions 181 of the spacer material layer 180 will be relatively thin as compared to the remaining vertical portions 182. After the anisotropic etch process 211, the spacer material layer 180 is further isotropically etched (e.g., by a highly selective wet etch process), stopping upon complete removal of the relatively thin horizontal portions 181, but prior to complete removal of the relatively thick vertical portions 182, thereby forming the gate sidewall spacers 185a-b (213, see FIG. 8). Since this etch process 213 is highly selective and performed without physically bombarding the wafer surface with ions, the portions 154a-b of the top surface 152 of the semiconductor layer 150, which are adjacent to the gate sidewall spacers 185a-b and which are exposed as the horizontal portions 181 of the spacer material layer 180 are etched away, are not damaged.

In one exemplary embodiment, this process 208 can comprise forming silicon nitride (SiN) gate sidewall spacers 185a-b on the opposing sidewalls 145 of a gate stack 140, particularly, without damaging the adjacent top surface 152 of a silicon layer 150 of an SOI wafer (208, see FIG. 1). Specifically, in this embodiment a blanket SiN layer 180 can be deposited such that it covers the gate stack 140 and also the exposed top surface 152 of the silicon layer 150 adjacent to the gate stack 140 (209, see FIG. 6). The SiN layer 180 can be deposited, for example, by chemical vapor deposition to a predetermined thickness (e.g., 50 nm). Next, the SiN layer 180 can be anisotropically etched, stopping just prior to exposing the top surface 152 of the silicon layer 150 (211, see FIG. 7). This anisotropic etch process can comprise a reactive ion etch (RIE) process that etches, for example, between 75% and 95% of SiN layer in the direction normal to the SOI wafer surface. Following this anisotropic etch process 211, horizontal portions 181 of the SiN layer 180 will remain on first portions 154a-b of the top surface 152 of the silicon layer 150 and also on the top surface 146 of the gate stack 140. Additionally, vertical portions 182 of the SiN layer 180 will remain on the opposing sidewalls 145 of the gate stack 140. Furthermore, since the etch process 211 is anisotropic, the remaining horizontal portions 181 of the SiN layer 180 will be relatively thin (e.g., 2-12 nm thick) as compared to the remaining vertical portions 182 (e.g., 45-50 nm thick). Following, the anisotropic etch process 211, the SiN layer 180 is further isotropically etched, stopping upon complete removal of the relatively thin horizontal portions 181, but prior to complete removal of the relatively thick vertical portions 182, thereby forming the SiN gate sidewall spacers 185a-b (213, see FIG. 8). This isotropic etch process can comprise a wet etch process that is highly selective for the SiN layer 180 over the silicon layer 150. For example, the wet etch process can comprise hydrofluoric acid (HF) etch process or any other suitable wet etch process having a selectivity ratio for the SiN layer over the silicon layer 150 of greater than 1000:1. Since this etch process 213 is highly selective and performed without physically bombarding the wafer surface with ions, the portions 154a-b of the top surface 152 of the silicon layer 150, which are adjacent to the SiN gate sidewall spacers 185a-b and which are exposed as the horizontal portions 181 of the SiN layer 180 are etched away, are not damaged.

Following formation of the gate sidewall spacers 185a-b at process 208, FET processing can be completed using conventional processing techniques (214). This FET processing 214 can include, but is not limited, implantation of source/drain dopants (e.g., n-type conductivity dopants for NFETs and p-type conductivity dopants for PFETs) to form source/drain regions 162a-b, silicide formation, interlayer dielectric deposition, contact formation, etc. (see FIG. 1). Such processing techniques are well-known in the art and, thus, the details of such processing techniques are omitted from this specification in order to allow the reader to focus on the salient aspects of the embodiments described herein.

Optionally, the FET processing 214 can also include, prior to silicide formation, formation of epitaxial semiconductor layer(s) 172a-b (e.g., epitaxial silicon layer(s)) on any one or both of the exposed portions 154a-b of the semiconductor layer 150 (216). Formation techniques for epitaxial semiconductor layers are well-known in the art and, thus, the details of such formation techniques are omitted from this specification in order to allow the reader to focus on the salient aspects of the embodiments described herein.

It should be noted that a pre-cleaning process should be performed prior to growing (i.e., epitaxially depositing) the epitaxial semiconductor layer(s) 172a-b at process 216 (215). However, this pre-cleaning process 215 does not have to be a discrete pre-cleaning process. Rather, it may be performed in-situ with the isotropic etch process 213, ex-situ to the isotropic etch process 213 or by a combination thereof. Additionally, it should be noted that the epitaxial semiconductor layer(s) 172a-b formed at process 215 can be either in-situ doped or subsequently implanted with appropriate dopants (e.g., n-type conductivity dopants for an NFET and p-type conductivity dopants for an NFET) in order to create raised epitaxial source/drain regions. In the event the epitaxial semiconductor layer(s) 172a-b are subsequently implanted, a single dopant implant process can optionally be used to form both the source/drain regions 162a-b within the semiconductor layer 150 and also the raised source/drain regions 172a-b above the semiconductor layer 150. Finally, it should be noted that process 215 can be performed such that the thicknesses 174a-b of the resulting epitaxial semiconductor layers 172a-b are the same (as illustrated) or, alternatively, such that the thickness 174a of the epitaxial semiconductor layer 172a above one source/drain region 162a is different from the thickness 174b of the epitaxial semiconductor layer 172b above the other source/drain region 162b. For example, above a source region, the epitaxial semiconductor layer may be formed relatively thick in order to minimize series resistance in the source region (i.e., in order to ensure that series resistance is less than a predetermined resistance value). However, above a drain region in the same FET, the epitaxial semiconductor layer may be formed relatively thin in order to minimize gate to drain capacitance (i.e., in order to simultaneously ensure that gate to drain capacitance is less than a predetermined capacitance value).

It should be understood that in the structure and method embodiments, described in detail above, n-type conductivity dopants can comprise, for example, Group V dopants, such as arsenic (As), phosphorous (P) or antimony (Sb) and p-type conductivity dopants can comprise, for example, Group III dopants, such as boron (B) or indium (In)).

It should further be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Disclosed above are embodiments of a planar field effect transistor (FET) structure on a semiconductor wafer (e.g., a silicon-on-insulator (SOI) wafer, a bulk silicon wafer, etc.), where the surface of the wafer, particularly, in the FET source/drain regions, is essentially damage-free. Also disclosed herein are embodiments of a method of forming such a FET structure. In the method embodiments, a gate stack is formed on the wafer surface above a designated channel region and, then, gate sidewall spacers are formed on the gate stack without damaging the adjacent wafer surface. Specifically, after spacer material is deposited over the gate stack, the spacer material is anisotropically etched (e.g., by reactive ion etch (RIE)) until just prior to exposing any horizontal surfaces of the wafer, thereby leaving relatively thin horizontal portions of spacer material on the wafer surface and relatively thick vertical portions of spacer material on the gate sidewalls. Then, the remaining spacer material is selectively and isotropically etched (e.g., by wet etch) just until the horizontal portions of spacer material are completely removed, thereby leaving only the vertical portions of the spacer material on the gate sidewalls. The isotropic etch process removes the horizontal portions of spacer material without damaging the wafer surface. Raised epitaxial source/drain regions can then be formed on the undamaged wafer surface adjacent to the gate sidewall spacer in order to tailor source/drain resistance values. Since the FET gate stack and gate sidewall spacers can be formed on a semiconductor layer that is extra thin (e.g., less than 10 nm but at least 1-3 nm thick) without simultaneously removing seed material required for the formation of raised epitaxial source/drain regions, the embodiments allow for a fully depleted planar FET architecture that has a natural ultra-shallow junction and that is suitable for the 22 nm technology node and beyond.

What is claimed is:

1. A field effect transistor comprising:
   a semiconductor substrate;
   an insulator layer on said semiconductor substrate;
   a semiconductor layer on said insulator layer, said semiconductor layer having a top surface and an essentially uniform thickness of less than 3 nm;
   a gate stack on said top surface, said gate stack having opposing sidewalls;
   gate sidewall spacers on said top surface adjacent to said opposing sidewalls;
   an epitaxial semiconductor layer on said top surface positioned laterally adjacent to said gate sidewall spacers;
   a channel region within said semiconductor layer aligned below said gate stack; and
   source/drain regions within said semiconductor, said channel region being positioned laterally between said source/drain regions, said top surface of said semiconductor layer being planar and said top surface being fully protected from silicon loss during processing such that said top surface is essentially damage-free and such that a first portion of said top surface of said semiconductor layer between said channel region and said gate stack is level with a second portion of said top surface of said semiconductor layer between said source/drain regions and epitaxial semiconductor layer.

2. The field effect transistor of claim 1, said semiconductor layer having a bottom that is essentially planar and parallel to said top surface such that a first thickness of said semiconductor layer at said channel region is equal to a second thickness of said semiconductor layer at said source/drain region.

3. The field effect transistor of claim 2, said second thickness being at least 1 nm.

4. The field effect transistor of claim 2, said second thickness being between 1 nm and 3 nm.

5. The field effect transistor of claim 2, further comprising raised source/drain regions in said epitaxial semiconductor layer, said gate stack being positioned laterally between said raised source/drain regions and electrically isolated from said raised source/drain regions by said gate sidewall spacers.

6. A field effect transistor comprising:
   a semiconductor substrate;
   an insulator layer on said semiconductor substrate;
   a semiconductor layer on said insulator layer, said semiconductor layer having a top surface and an essentially uniform thickness of less than 3 nm;
   a gate stack on said top surface, said gate stack having opposing sidewalls;
   gate sidewall spacers on said top surface adjacent to said opposing sidewalls;
   a channel region within said semiconductor layer aligned below said gate stack; and
   a first source/drain regions and a second source/drain region within said semiconductor layer, said channel region being positioned laterally between said first source/drain regions and said second source/drain region; and
   a first epitaxial semiconductor layer on said top surface of said semiconductor layer above said first source/drain region and a second epitaxial semiconductor layer on said top surface of said semiconductor layer above said second source/drain region, said first epitaxial semiconductor layer and said second epitaxial semiconductor layer having different thicknesses, said top surface of said semiconductor layer being planar and said top surface being fully protected from silicon loss during processing such that said top surface is essentially damage-free and such that a first portion of said top surface of said semiconductor layer between said channel region and said gate stack is level with second portions of said top surface of said semiconductor layer between said first source/drain regions and said first epitaxial semiconductor layer and between said second source/drain region and said second epitaxial semiconductor layers.

7. The field effect transistor of claim 6, said semiconductor layer having a bottom that is essentially planar and parallel to said top surface such that a first thickness of said semiconductor layer at said channel region is equal to second thicknesses of said semiconductor layer at said source/drain regions.

8. The field effect transistor of claim 6, said semiconductor layer, said first epitaxial semiconductor layers and said second epitaxial semiconductor layer comprising single crystalline silicon layers.

9. The field effect transistor of claim 6, said first source/drain region comprising a source region, said first epitaxial semiconductor layer having a first thickness, said second source/drain region comprising a drain region, and said second epitaxial semiconductor layer having a second thickness that is less than said first thickness.

10. The field effect transistor of claim 6, further comprising source/drain extension regions in said semiconductor layer aligned below said gate sidewall spacers and positioned laterally between said channel region and said source/drain regions.

* * * * *